US010141087B2

(12) United States Patent
Rougier et al.

(10) Patent No.: US 10,141,087 B2
(45) Date of Patent: Nov. 27, 2018

(54) WIRING HARNESS PRODUCTION MOUNTING

(71) Applicant: LASELEC, Toulouse (FR)

(72) Inventors: Stephane Rougier, Pompertuzat (FR); Michel Viault, Mas-Grenier (FR)

(73) Assignee: LASELEC, Toulouse (FR)

(*) Notice: Subject to any disclaimer, the term of this patent is extended or adjusted under 35 U.S.C. 154(b) by 153 days.

(21) Appl. No.: 14/888,868

(22) PCT Filed: May 2, 2014

(86) PCT No.: PCT/FR2014/051053
§ 371 (c)(1),
(2) Date: Nov. 3, 2015

(87) PCT Pub. No.: WO2014/181060
PCT Pub. Date: Nov. 13, 2014

(65) Prior Publication Data

US 2016/0064121 A1 Mar. 3, 2016

(30) Foreign Application Priority Data

May 6, 2013 (FR) .................................... 13 54149

(51) Int. Cl.

| | |
|---|---|
| ***B23P 19/00*** | (2006.01) |
| ***H05K 13/04*** | (2006.01) |
| ***H01B 13/012*** | (2006.01) |
| *H01R 43/28* | (2006.01) |

(52) U.S. Cl.
CPC . *H01B 13/01236* (2013.01); *H01B 13/01227* (2013.01); *H01R 43/28* (2013.01); *Y10T 29/5313* (2015.01)

(58) Field of Classification Search
CPC ............... Y10T 29/49826; Y10T 29/53; Y10T 29/5313; Y10T 29/53265; H01B 13/01227; H01B 13/01236
USPC ......... 29/729, 743, 744, 747, 748, 760, 854, 29/857, 861, 866, 868
See application file for complete search history.

(56) References Cited

U.S. PATENT DOCUMENTS 8,996,347 B2 * 3/2015 MacLean ......... H01B 13/01227 703/13
2003/0030206 A1 2/2003 Masukawa et al.
(Continued)

FOREIGN PATENT DOCUMENTS

CN 202059112 U 11/2011
DE 10 2011 084786 A1 4/2013
(Continued)

OTHER PUBLICATIONS

International Search Report, dated Jul. 29, 2014, from corresponding PCT application.
(Continued)

*Primary Examiner* — Thiem Phan
(74) *Attorney, Agent, or Firm* — Young & Thompson

(57) ABSTRACT

The wiring harness production mounting, includes: at least one screen for displaying data aiding in the production of wiring harnesses, and at least one attachment surface associated with the at least one display screen, the at least one attachment surface being configured to receive at least one cable-routing element.

19 Claims, 7 Drawing Sheets

(56) References Cited

U.S. PATENT DOCUMENTS

Figure 4:
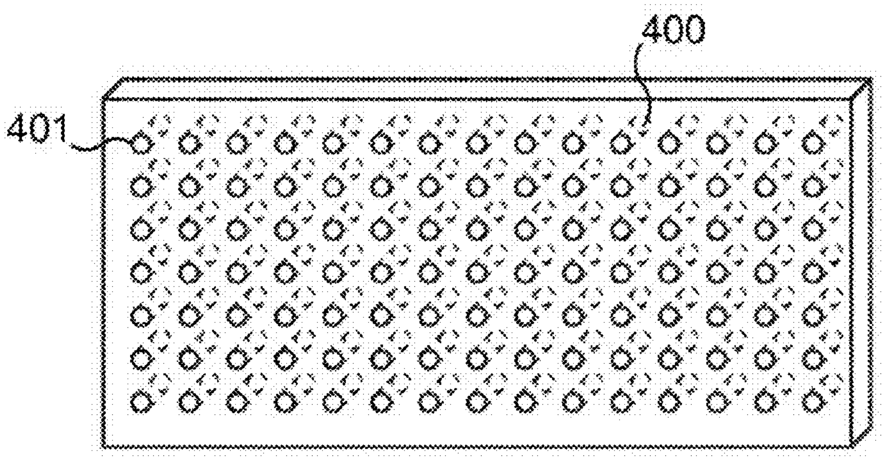

| | | | |
|---|---|---|---|
| 2003/0163917 | A1 | 9/2003 | Davidshofer et al. |
| 2009/0265923 | A1 | 10/2009 | MacLean et al. |

FOREIGN PATENT DOCUMENTS

| | | | |
|---|---|---|---|
| JP | H10 283856 | A | 10/1998 |
| JP | 2002 218634 | A | 8/2002 |

OTHER PUBLICATIONS

Chinese Office Action issued in Application No. 201480025640.6, dated Dec. 14, 2017.

* cited by examiner

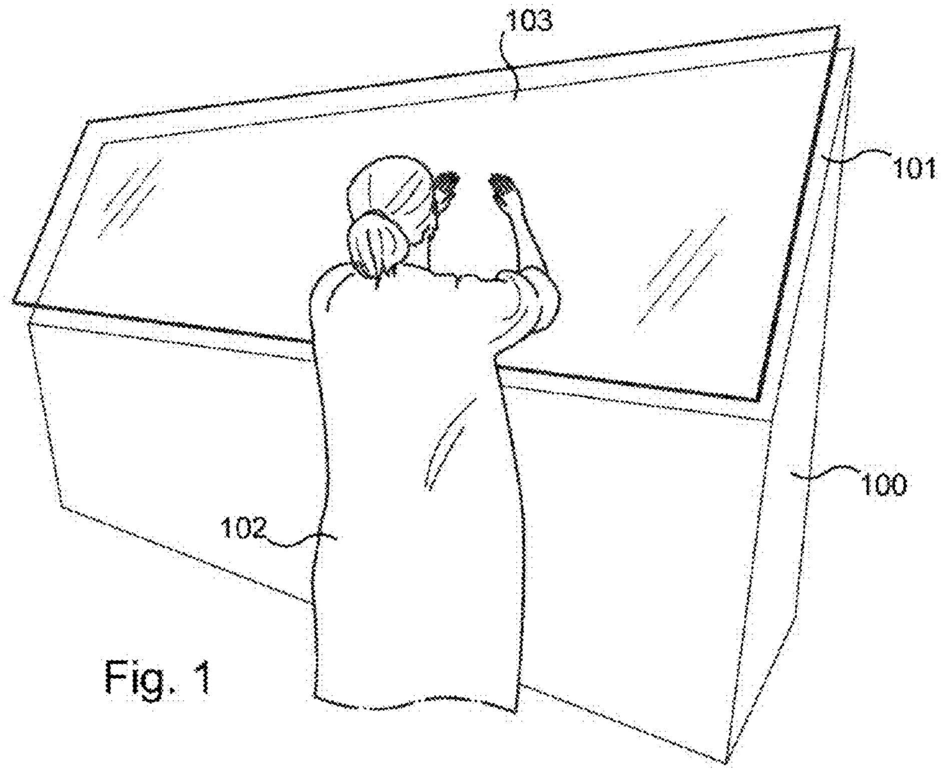
Fig. 1
Fig. 2a
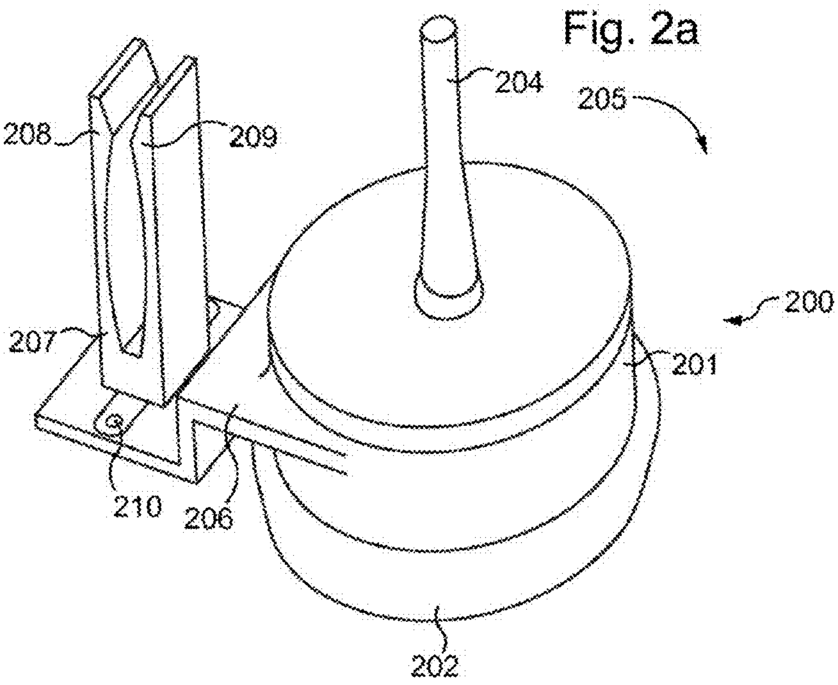

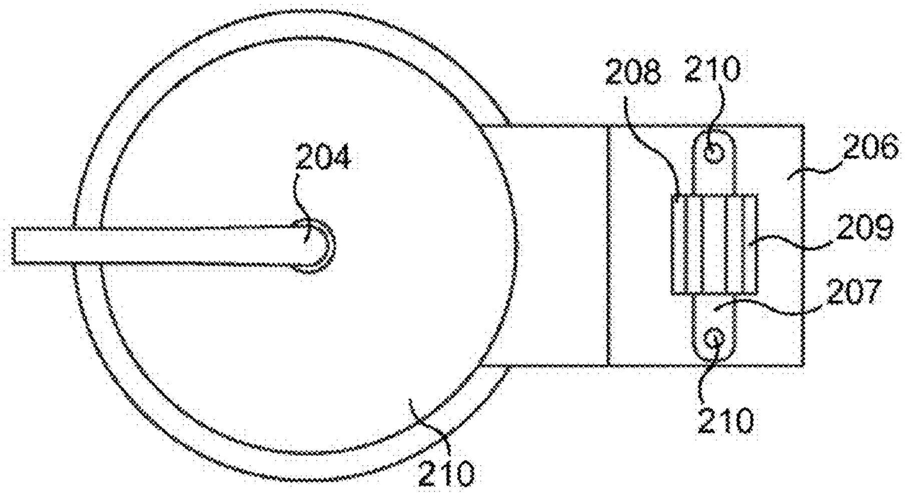
Fig. 2b
Fig. 2c
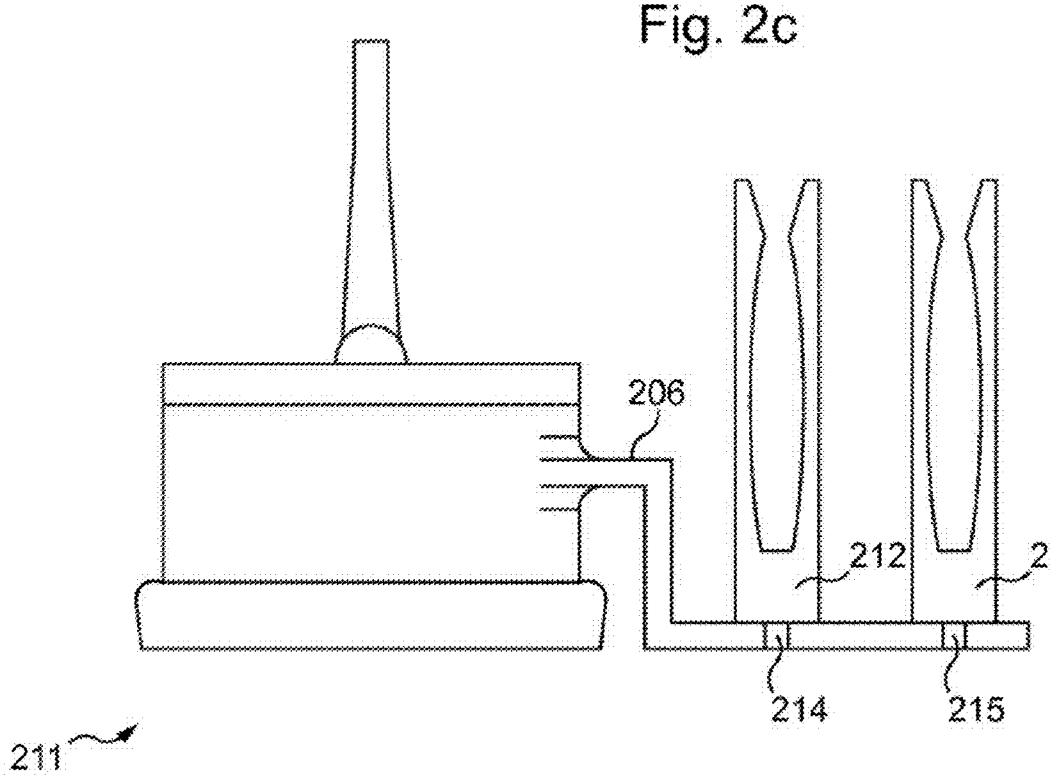

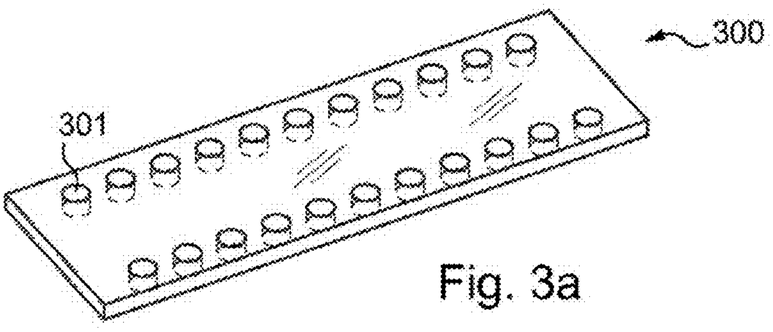
Fig. 3a
Fig. 3b
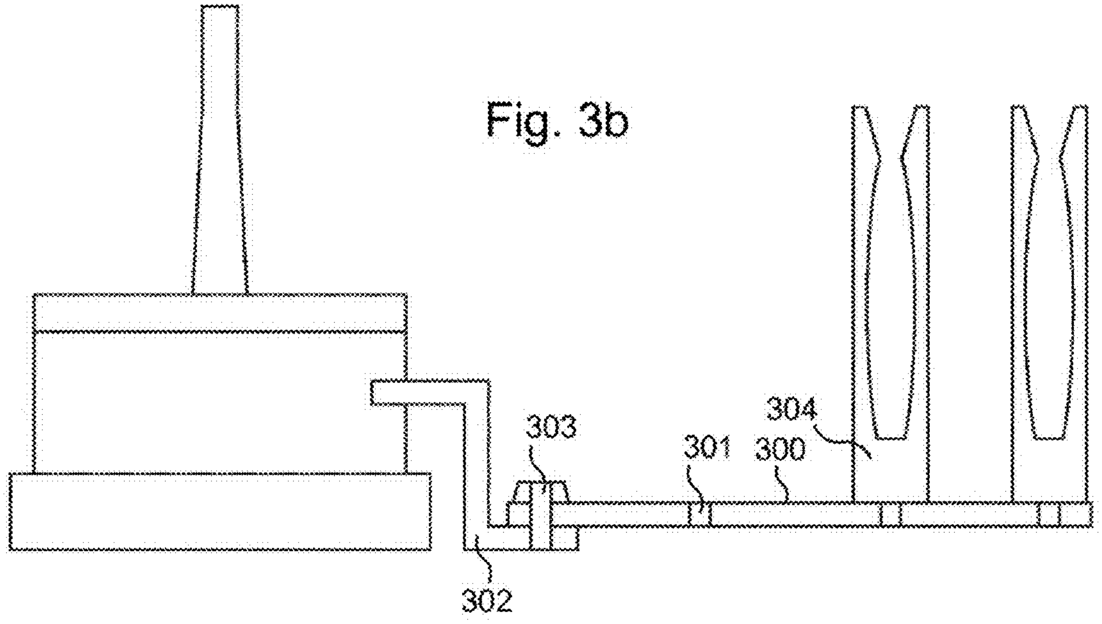
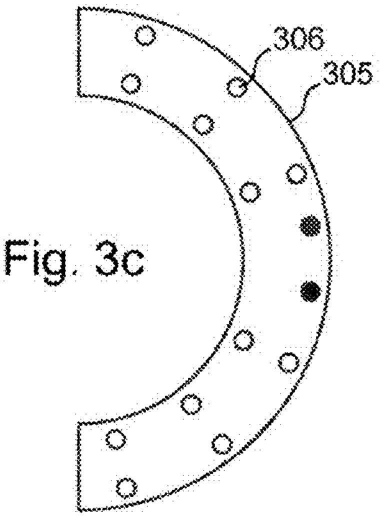
Fig. 3c

WIRING HARNESS PRODUCTION MOUNTING

The present invention relates to the production of wire harnesses. More particularly, it relates to assisting with the production of such harnesses.

A wire harness comprises a set of connectors linked together by cables (or wires). These cables are for example electrical cables, optical fibres or others.

Electrical harnesses are typically designed using computer-aided design tools. These tools make it possible to generate wiring diagrams for electrical harnesses. For example, these tools make it possible to design the electrical connections present in an aircraft.

Once the wiring diagrams have been obtained, they are printed and given to operatives to physically carry out the production of these harnesses, in accordance with the cabling which is shown thereon. Typically, these wiring diagrams are printed on paper in AO format.

An electrical harness production operative who receives such a wiring diagram firstly checks the dimensions of the wiring diagram and the print quality. Then, the operative places the wiring diagram on a wiring table.

The wiring table typically comprises a board on which the printed wiring diagram is bonded as well as a transparent sheet for covering the wiring diagram. The board is for example made of wood. The transparent sheet is for example made of plastic.

The operative then arranges the electrical cables and connectors of the harness to be produced on the transparent sheet, in accordance with the layout of the wiring diagram arranged on the board. To this end, the operative can route the cables using nails, wire supports or predefined forms.

In order to know the route to be followed by a given cable, the operative can refer to cable numbers marked on tags attached to the cables and search lists of correspondence between these cable numbers and the route numbers which are themselves marked on the printed wiring diagram.

Although these lists can be presented in computerized form and facilitate the search for the route number corresponding to a cable number, the task remains tedious and complicated for the operatives.

In fact, the wiring table can sometimes reach several tens of meters and the search for the relevant route on the printed wiring diagram can be difficult, in particular when the wiring diagram comprises a large number of intertwined cables. For the same reasons, following the route can also be tedious, in particular when the starting point of the cable is far from the end point.

Once the cables have been arranged on the board in accordance with the printed wiring diagram, the operative connects the wires arriving to a single connector.

In order to know which connector pin each cable must be connected to, the user must once again consult a list showing the correspondence between the cable numbers and pin numbers. Here again, the task is tedious and there are risks of a poor connection.

Other tasks are carried out by the operative, still according to the same principle of consulting correspondence lists (in particular in order to know the type of contact to use on the cable, the length of cable to be stripped, the appropriate crimping tool or other).

Apart from the tedious nature of harness production and the significant risks of error, any change in design of the harness leads to modification of the wiring diagram and therefore requires the latter to be replaced on the table.

It is then necessary to remove all the routing supports and tools placed on the transparent sheet, the wiring diagram, and then replace these supports and tools.

Updating the wiring diagram therefore also leads to considerable inconvenience for the operative and is also a source of errors.

Finally, as arranging the routing supports and tools on the wiring table is tedious, in order to avoid performing this task too often, one wiring table per harness type is frequently used. Thus, arrangement is carried out once and for all and depending on the demand for this type of harness, the wiring table is reused.

However, the more the number of harness references increases, the more the number of wiring tables increases. Then a problem arises of storing the tables (which can be several tens of meters long).

The inventors have thus noted a need to optimize the production of wire harnesses.

The present invention relates to this field.

A first aspect of the invention relates to a wire harness production support comprising:

- at least one display screen for data for assisting with the production of wire harnesses,
- at least one attachment surface associated with said at least one display screen, said at least one attachment surface being configured to receive at least one cable routing element.

A support according to the first aspect allows flexibility for reconfiguring the support while offering the possibility of dynamically assisting the user in his production task.

A support according to the first aspect offers an industrial tool allowing productivity to be optimized in wire harness production facilities.

Said cables can be electrical cables, optical fibres or others.

Moreover, the dynamic display offers an optimization of the quality of the harnesses produced while minimizing the risks of error by the production operatives.

The use of one or more display screens allows reuse of the support for different types of wire harness.

For example, said at least one attachment surface is configured to receive at least one extension, said extension being configured to receive a plurality of routing elements.

Thus, it is possible to adapt the routing of the cables to different types of wiring diagrams.

Said attachment surface can comprise at least one flat portion for the attachment of at least one suction cup cable routing element or of at least one extension.

The suction cup routing elements allow easy repositioning for the user. They also offer good attachment of the cables on the support.

For example, said attachment surface or said extension comprises at least one first cooperation element for cooperating with a second cooperation element of at least one cable routing element or of at least one extension, said cooperation allowing the attachment of said at least one cable routing element or of said extension.

The cooperation elements can have different forms such as clips, hooks or other.

According to embodiments, said first cooperation element comprises a hole for the attachment of said at least one cable routing element or of said extension by insertion of a rod of said second cooperation element into said at least one hole.

The support can comprise at least one illuminated screen.

For example, the support comprises at least one touch screen.

The support can also comprise a rear-projection screen.

The support can comprise one, two or any other number of screens, in particular depending on the size of the support.

It is therefore possible to envisage multi-user uses, i.e. that several users can simultaneously participate in the production of the wire harness.

The support can comprise a communication interface.

This interface can be configured to receive signals representative of said data for assisting with the production of wire harnesses for display.

These data can be received from a remote device, such as a supervisory device.

The interface can also be configured to receive user interface data.

The user interface can be a keyboard, a mouse, a barcode reader or other.

The support can also comprise a processing unit configured to implement a method according to the third aspect below.

A second aspect of the invention relates to a system for the production of wire harnesses, comprising:

- at least one support according to one of the preceding claims,
- at least one cable routing element, and/or
- at least one extension configured to receive a plurality of routing elements.

The cables are for example electrical cables, optical fibres or others.

For example, said at least one cable routing element and/or said extension comprises an attachment suction cup.

For example, said at least one cable routing element and/or said extension comprises at least one second cooperation element for cooperating with a first cooperation element of said attachment surface of said support, said cooperation allowing the attachment of said at least one cable routing element or of said extension.

For example, said second cooperation element comprises a rod configured for insertion into a hole of the first attachment element for the attachment of said at least one cable routing element or of said extension.

For example, said extension comprises at least one flat portion for the attachment of at least one suction cup cable routing element or of at least one extension.

A third aspect of the invention relates to a method for assisting with the production of wire harnesses comprising the following steps:

- displaying, on a screen, a wiring diagram of said wire harness,
- determining at least one cable to be placed on a wire harness production support,
- displaying, on said wiring diagram, at least one route associated with said at least one determined cable.

The method according to the third aspect allows an arrangement of the data relating to the production of wire harnesses which facilitates user interaction with the support in order to produce the harness. Thus the user is offered assistance in the interaction with the wire harness support. The user is also offered an optimized industrial production tool.

The method according to the third aspect is not intended to produce a simple presentation of the cognitive content of the data for assisting with the production of wire harnesses, but is intended to offer a particular arrangement of this information in order to highlight directly, for the user, information and interactions that are relevant for the use of the wire harness production support and the production itself of the wire harness.

The display according to the method according to the third aspect offers a technical effect which is manifested at the level of the interaction of the user with the production support, allowing him to carry out the tasks necessary for the production of the harness more rapidly and more efficiently.

The method according to the third aspect offers in particular a dynamic and progressive display of the data necessary for the production of the harness on the support depending on the interactions of the user with the support.

The method according to the third aspect makes it possible to offer an optimized industrial tool for the production of wire harnesses.

The method can also comprise a step of displaying, on said wiring diagram, at least one marker for the attachment of at least one cable routing element onto an attachment surface associated with said screen.

The method can also comprise a step of displaying a first list of cables to be placed on said support, for the selection, by a user, of at least one cable from the list.

The method can also comprise the following steps:

- determining at least one connector to be placed on said support, and
- displaying a second list of cables to be connected to said connector.

The method can also comprise the following steps:

- selecting at least one cable from said second list,
- displaying an information window relating to at least one operation to be performed by a user on said at least one selected cable.

For example, said window comprises the designation of at least one tool to be used for performing said operation.

The method can also comprise the following steps:

- determining a first identifier associated with said at least one tool for performing a cable operation,
- comparing said first identifier with a second identifier associated with said at least one tool designated in said information window, and
- displaying an error message in the case of non correspondence between the first and second identifiers.

The method can also comprise the following steps:

- determining a first identifier associated with said at least one tool for performing a cable operation,
- comparing said first identifier with a second identifier associated with said at least one tool designated in said information window, and
- displaying an information window relating to at least one following operation to be performed by a user on said at least one selected cable in the case of correspondence between the first and second identifiers.

The method can also comprise the following steps:

- determining a first identifier associated with said at least one tool for performing a cable operation,
- comparing said first identifier with a second identifier associated with said at least one tool designated in said information window, and
- displaying information relating to said operation in the case of correspondence between the first and second identifiers.

For example, said first identifier is determined by reading a data medium associated with said at least one tool for performing a cable operation.

A fourth aspect of the invention relates to a computer program as well as a computer program product and a storage medium for such programs and product, allowing the implementation of a method according to the first aspect when the program is loaded and executed by a processor in particular of a wire harness production support and/or a system for the production of wire harnesses and/or a supervisory device for a wire harness production support.

A fifth aspect of the invention relates to a data recording medium comprising a first recording portion for recording a wiring diagram for wire harnesses and a second recording portion for data for assisting with the production of wire harnesses.

The objects according to the second, third, fourth and fifth aspects of the invention provide at least the same advantages as those provided by the support according to the first aspect.

Figure 5:
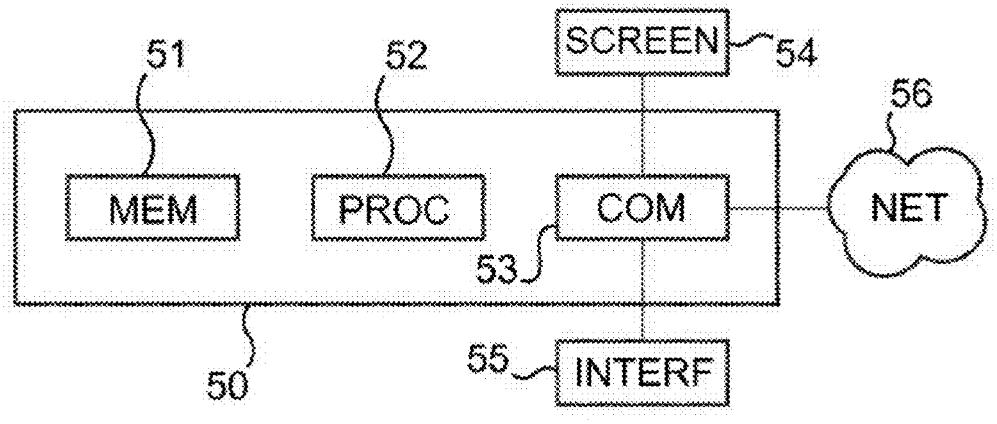
Figure 6:
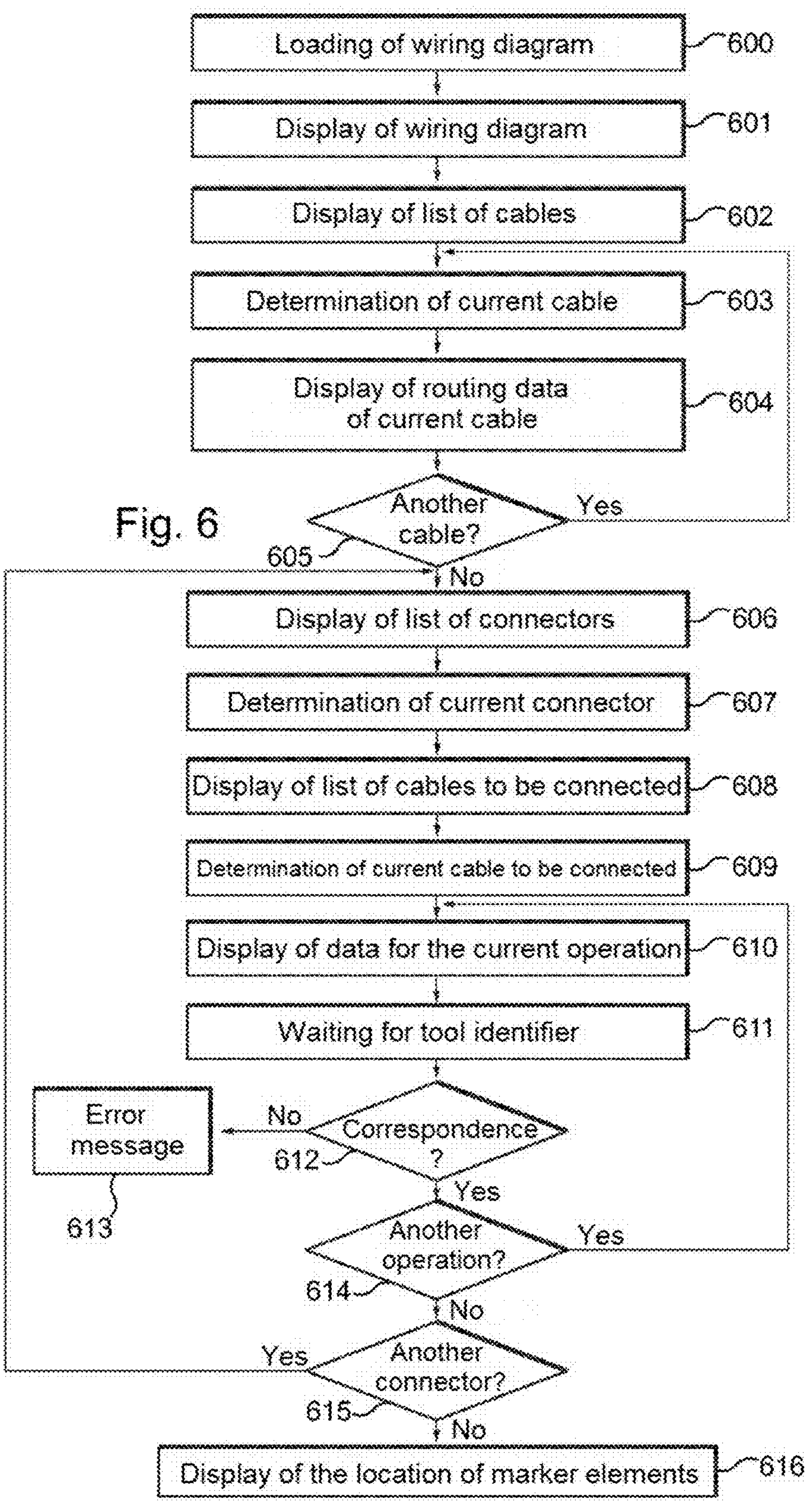

Other characteristics and advantages of the invention will become apparent on reading the present detailed description which follows, by way of non limitative example, and the attached figures in which:

FIG. 1 diagrammatically shows a support according to embodiments;

FIGS. 2*a* to 2*c* diagrammatically show cable routing elements according to embodiments;

FIGS. 3*a* to 3*c* diagrammatically show extensions according to embodiments;

FIG. 4 diagrammatically shows an attachment support according to embodiments;

FIG. 5 diagrammatically shows a computer module according to embodiments;

FIG. 6 is a flow chart of steps implemented according to embodiments; and

FIGS. 7*a* to 7*g* show screen displays according to embodiments.

With reference to FIG. 1, a wire harness production support according to embodiments is described diagrammatically.

The support comprises a support structure 100 on which at least one screen 101 rests. The screen is configured to display data for assisting a user 102 with the production of wire harnesses. Based on these data, the user arranges cables on an attachment surface 103 in order to form the harness to be produced. To this end, the user attaches cable routing elements onto the attachment surface. The user can also arrange connectors on the attachment surface in order to connect the cables. The user can also arrange on the attachment surface any other element forming the harness to be produced.

The cables are for example electrical cables, optical fibres or others.

In the rest of the description, the non-limitative example of electrical cables will be adopted.

However, optical fibres could be used. For example, the connectors used would then be optical fibre connectors.

Thus, in the rest of the description, when reference is made to electrical cables, electrical connectors, electrical cable routing elements or others, this does not limit the subject of the present invention to electrical cables or to electrical harnesses.

A person skilled in the art can adapt the teachings hereinafter to other types of cables, to optical fibres or others.

FIG. 2*a* shows an electrical cable routing element 200 according to embodiments. The routing element is shown in perspective.

The electrical cable routing element comprises a body 201. For example, the body of the electrical cable routing element is substantially cylindrical.

A suction cup 202 is attached onto a lower face of the body of the electrical cable routing element. For example, the suction cup is a lever suction cup. In this case, the lever 204 of the suction cup is attached onto an upper face of the body 201 opposite the lower face. Thus, when the lever is in the raised position (as shown in FIG. 2*a*), the user freely arranges the electrical cable routing element on the attachment surface. Once in the desired position on the attachment surface, the user moves the lever to the lowered position (following the arrow 205), which attaches the suction cup and therefore the electrical cable routing element onto the attachment surface of the support.

An arm 206 extends laterally from the body of the electrical cable routing element. This arm supports one or more electrical cable attachment elements 207. For example the arm 206 has the form of a plate. In a further example, the arm can be bent so that the end of the arm towards which it extends from the body is at the same level as the suction cup. Thus, when the suction cup is attached to the attachment surface, this end of the arm is at the level of the attachment surface. For example, the arm 206 is bent twice at right angles.

The electrical cable attachment element 207 comprises for example a clip with two prongs 208 and 209 between which an electrical cable can be inserted by force. The electrical cable attachment element is firmly attached to the arm 206, for example by screwing into at least one hole 210 at the end of the arm. In a further example, a rod of the electrical cable attachment element can simply be inserted into the hole. Screwing need not then be used. The hole(s) 210 can be blind holes.

In embodiments (as shown) the cable attachment element can also comprise two parallel rods with no prong. Each rod is then independent and can be inserted into a respective hole in the arm 206. In this case, the holes are at a distance corresponding to the width necessary to allow the insertion of the electrical cables between the two rods.

FIG. 2*b* shows the electrical cable attachment element of FIG. 2*a* in a top view. This view shows the lever 204 in the lowered position (suction cup attached) and the electrical cable attachment element 207 with the two prongs 208 and 209. The arm 206 extending from the body 204, on which the electrical cable attachment element is attached in two holes 210, is also shown.

FIG. 2*c* shows an electrical cable routing element 211. This electrical cable routing element has the same structure as that described with reference to FIGS. 2*a* and 2*b*. Here, the arm 206 can support two electrical cable attachment elements 212 and 213. The arm 206 then comprises two holes or two series of holes 214 and 215 to accommodate the two electrical cable attachment elements.

Cable routing elements can accommodate one, two or any other number of electrical cable attachment elements.

To this end, an extension can be attached onto the arm 206 of a cable routing element.

Such an extension 300 is shown in FIG. 3*a*. For example, the extension has a substantially rectangular shape. Holes 301 are arranged along the extension in order to accommodate cable attachment elements. The holes can be blind holes.

As shown in FIG. 3*b*, holes 301 can be used to attach one end of the extension firmly to the arm 302 of a cable routing element. For example, this firm attachment is carried out by means of a screw 303 or an attachment rod. The holes 301 can also be used for arranging cable attachment elements 304 all along the extension.

The extension can have shapes other than rectangular. For example, as shown in FIG. 3*c*, the extension 305 has a substantially semi-circular shape. The extension comprises holes 306 all along its circumference in order to accommodate cable attachment elements. The extension also comprises holes in order to allow it to be firmly attached to a cable routing element.

As described above, the cable routing elements can comprise a suction cup in order to be attached onto the attachment surface of the support. The attachment surface can then be shaped to be approximately flat in order to allow attachment by suction cup.

However, other ways of attaching cable routing elements are possible. For example, holes can be made directly in the attachment surface in order to accommodate cable attachment elements directly or indirectly, thus acting as electrical cable routing elements.

FIG. 4 shows an attachment surface 400 configured to accommodate electrical cable attachment elements directly or indirectly.

This attachment surface comprises a set of holes 401. For example these holes are arranged regularly in a distribution grid.

In order to allow the use of cable routing elements on the surface 400, the holes 401 are for example blind holes and these holes are spaced apart so as to allow a suction cup to be attached.

Embodiments other than those described above are possible.

For example, instead of using suction cup attachments for cable routing elements, it is possible to use magnetic attachments (with magnets).

In a further example, the extensions can be firmly attached to the cable routing elements by means other than screws or rods. It is possible to use clips or other.

In a further example, the cable attachment elements can have other forms such as hooks or other.

The support can comprise a plurality of screens, which can be useful for supports of large dimensions for the production of electrical harnesses of large dimensions.

For the implementation of methods according to embodiments, the production support can comprise data processing elements as shown in FIG. 5.

FIG. 5 shows a computer module 50 configured for managing the display of data for assisting with the production of electrical harnesses.

The module 50 comprises a memory unit 51 (MEM). This memory unit comprises a random access memory for volatile storage of calculation data utilized during the implementation of a method according to an embodiment. The memory unit also comprises a non-volatile memory (for example of the EEPROM type) for storing for example a computer program according to an embodiment for its execution by a processor (not shown) of a processing unit 52 (PROC) of the equipment. The memory can also store other data such as for example a wiring diagram file, data for assisting with the production of electrical harnesses or other.

The equipment also comprises a communication unit 53 (COM) for implementing communications. For example, the communication unit can allow the transmission of display data to a screen 54 (SCREEN) of the production support in order to display to the user, via the screen, elements for assisting with the production of electrical harnesses as described hereinafter. In a further example, the communication unit can allow communication with a user interface 55 (INTERF). This user interface can for example be a keyboard, a mouse, a barcode reader or other. The interface can allow the user to select a cable the routing of which he wishes to view in a wiring diagram, and can also allow him to identify a tool for carrying out an operation on a cable or other. Possible uses of the interface are described below.

The screen 54 can be of different types, it can be an illuminated screen (of the LCD, LED, plasma or other type), it can also be a rear-projection screen (in this case, the support and the computer module are combined with a device for projection onto the screen).

According to embodiments, the screen 54 is a touch screen. In this case, the interface 55 and the screen 54 can be incorporated into a single unit.

The communication unit 53 can also allow communication via a communication network 56 (NET) with a remote supervisory device. For example, the supervisory station can transmit a file of a wiring diagram to be displayed or transmit production assistance data to be displayed. Other types of data can be transmitted. For example, in a production facility where several supports according to embodiments are present, a supervisory device can allow the simultaneous updating of several supports with new wiring diagram files or other. A supervisory device can also make it possible to monitor in real time the progress of the production of electrical harnesses in a production facility.

A method for assisting with the production of electrical harnesses is described below with reference to FIG. 6. The method can be implemented by a computer module, for example a computer module of a support for the production of electrical harnesses. The method can also be implemented by a supervisory device such as mentioned above.

In a step 600, a file comprising an electrical harness wiring diagram is loaded into a memory in order to be displayed on a screen with data for assisting with the production of the harness.

The wiring diagram data are for example combined with the production assistance data in a single file. The two types of data can also belong to separate files.

The data (for cabling and/or for assisting with the production of harnesses) can for example originate from a supervisory device or be loaded from recording media or from a communication network.

The wiring diagram is then displayed on a screen in a step 601.

Figure 7A:
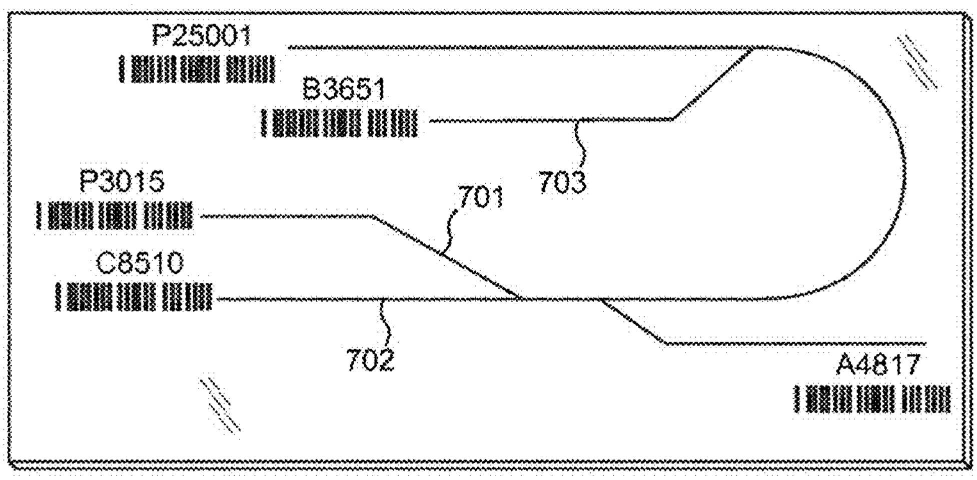

Such a wiring diagram 700 is shown in FIG. 7*a*. The wiring diagram comprises the routing layout of different cables of the harness to be produced. In some portions of the wiring diagram, the cables follow the same route. In other portions, they each follow their own route. At each cable end, a number identifying this end is displayed. This number is for example accompanied by a barcode that represents it.

Thus, in this example, a cable 701 is arranged between the ends P3015 and A4817. A cable 702 is arranged between the ends C8510 and P25001. A cable 703 is arranged between the ends B3651 and C8510.

For example the cable between the ends P3015 and A4817 has a portion of its route in common with the cable between the ends C8510 and P25001 on the one hand and with the cable between the ends C8510 and B3651 on the other hand.

Generally, several cables can be arranged between the different ends.

Once the wiring diagram is displayed, in order to allow the user to arrange cable routing elements (for example using a suction cup as described above) and to arrange the cables themselves in accordance with the wiring diagram, a list showing the cables to be placed on the cable production support is displayed on the screen in a step 602.

Figure 7B:
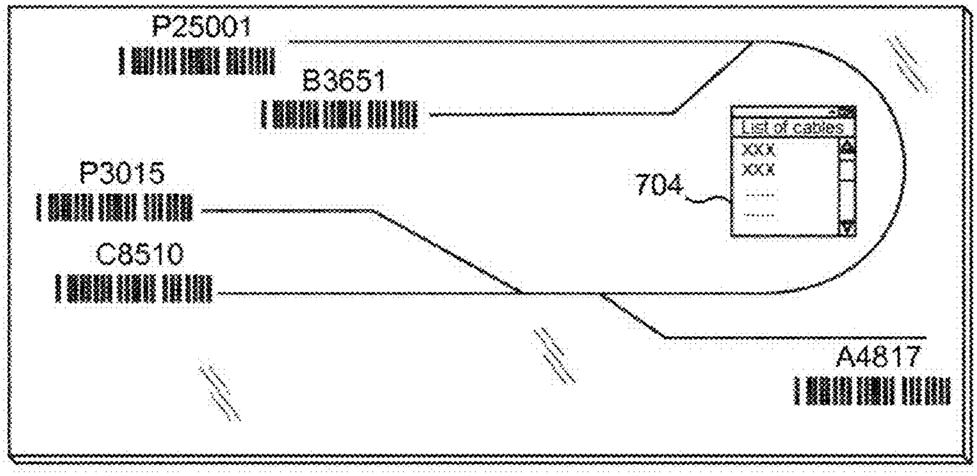

Such a list is shown in FIG. 7*b* which reproduces the elements of FIG. 7*a*.

The list of cables is displayed in a window 704. The window 704 is for example a scrolling list showing cable identifiers. The cable identifiers can moreover be carried on tags attached to the cables that the user must arrange on the support.

The window 704 can be displayed in a specific area of the screen. For example, the window is displayed in a fixed area provided for this purpose. The window can also be displayed dynamically depending on the wiring diagram already displayed, in a clear area through which no cable passes.

A current electrical cable to be arranged on the electrical harness production support is then determined in a step 603.

When the list of cables has been displayed, the user can select a cable to be arranged on the support. To this end, he can for example click on a cable number in the window 704 by means of a mouse of a user interface. The user can also directly tap on the screen if it is a touch screen. The user can also enter the cable number directly via a keyboard.

According to embodiments, the user does not have a choice of the cable to be arranged. For example, the cables are classified in an order to be followed for arranging the cables. The user is then informed, in the window 704, of the cable to be arranged. For example, the number of the cable is highlighted.

After the user has chosen a cable to be arranged, or this has been determined automatically, routing data of the determined cable are displayed in a step 604.

Figure 7C:
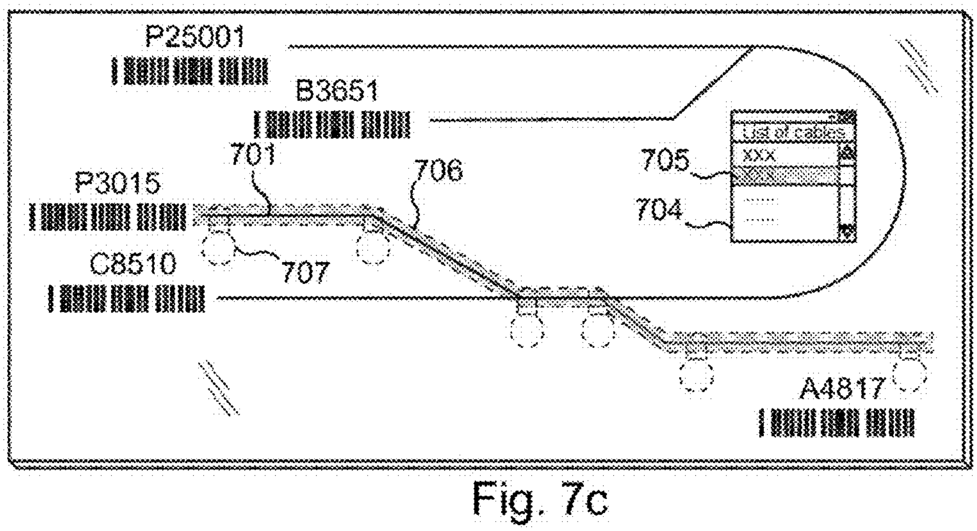

For example, as shown in FIG. 7*c*, the user clicks on the element 705 of the list in the window 704. The element 705 shows the identifier of an electrical cable to be arranged on the support. This element is then highlighted.

In the example of FIG. 7*c*, the user has chosen the cable 701.

Following the determination of the cable to be arranged on the support, the determined cable routing is shown on the wiring diagram. For example, the layout of the route to be followed by the determined cable is displayed in a colour different from that used to display the remainder of the wiring diagram. In a further example, the layout of the route to be followed by the cable is surrounded by dotted lines 706.

Moreover, markers 707 can also be displayed for the placing of the cable routing elements on the support. Such markers are for example outlines on which the user must place the routing elements.

Figure 7D:
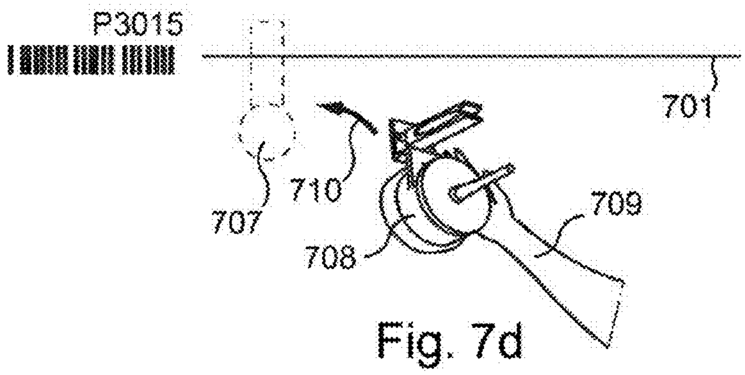

The placing of a routing element in accordance with a cable routing element placing marker is shown in FIG. 7*d*.

FIG. 7*d* is a detail of the end P3015 of the cable 701. The outline 707 of a routing element is displayed on the screen in dotted lines, at the position where the routing element must be placed. For example, the routing element is a suction cup routing element as already described above. The outline comprises a circular portion corresponding to the suction cup and a rectangular portion corresponding to an arm in the form of a plate.

The user 709 places a routing element 708 corresponding to the marker 707 (arrow 710).

When the user has placed all the routing elements for a current cable, he can place the cable in accordance with the displayed wiring diagram by attaching the cable to the cable attachment elements of the cable routing elements.

Once the cable routing data are displayed for the current cable, in a step 605 it is determined whether other cables remain to be arranged on the electrical harness production support. It is for example verified whether all the cables from the list in the window 704 have been considered.

In order to find whether it is possible to move on to a following electrical cable in the list, it is possible to wait for the user to choose another cable from the list (for example by clicking on another identifier in the list or by entering another identifier on the keyboard or other) or to wait for the user to confirm the arrangement of all the cables by closing the window 704.

It is also possible to determine automatically whether all the routing elements for the current cable have been attached onto the attachment surface at the locations indicated by the placing markers. For example, confirmation windows (not shown) can be open close to each marker and allow the user to confirm the attachment of the corresponding routing element. It is also possible to determine the attachment of a routing element by detecting pressure at the level of the displayed placing marker (for example if the screen used is a touch screen).

Alternatively, it is possible to envisage that the cables are arranged on the cable production support only after all the cable routing elements have been attached onto the support.

For example, a window is displayed to the user in order to show a list of cable routing elements to be used (the list comprises for example the different types of elements and number of elements for each type). The user then assembles these elements close to the cable production support. The user then launches a display of the wiring diagram showing him at what locations to attach the routing elements that he has assembled.

If, in step 605, it is determined that another cable is to be considered (YES), there is a return to the already described step 603.

Otherwise (NO), a list of connectors to be arranged on the attachment support is displayed on the screen in a step 606. This display can be accompanied by clearing the window 704 relating to the list of the cables to be arranged on the electrical harness production support.

Figure 7E:
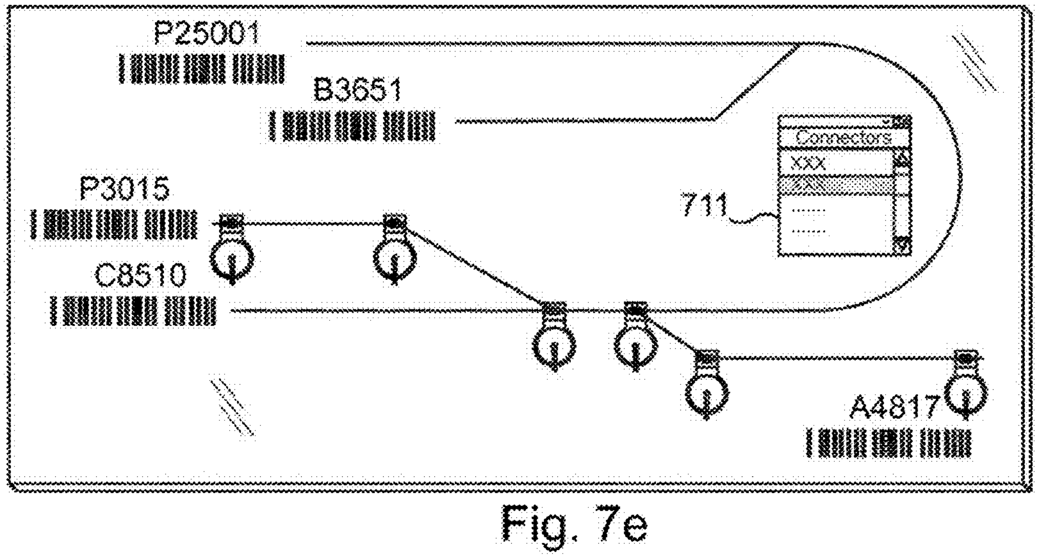

The list of connectors is displayed in a window 711 shown in FIG. 7*e*. The window 711 is for example a scrolling list showing identifiers of connectors. The identifiers of connectors can also be carried on tags attached to the connectors that the user must arrange on the support.

The window 711 can be displayed in a specific area of the screen. For example, the window is displayed in a fixed area provided for this purpose. The window can also be displayed dynamically depending on the wiring diagram already displayed, in a clear area through which no cable passes.

A current electrical cable connector to be arranged on the electrical harness production support is then determined in a step 607.

When the list of connectors has been displayed, the user can select a connector to be arranged on the support. To this end, he can for example click on a connector number in the window 711 by means of a mouse of a user interface. The user can also directly tap on the screen if it is a touch screen. The user can also enter the cable number directly via a keyboard. In combination, or as an alternative, the user can read the barcode associated with the connector directly on the screen if it is displayed.

According to embodiments, the user does not have the choice of the connector to be arranged. For example, the connectors are classified in an order to be followed for arranging the connectors. The user is then informed, in the window 711, of the connector to be arranged. For example, the number of the connector is highlighted.

After the user has chosen a connector to be arranged, or this has been determined automatically, a new list of cables is displayed in a step 608. This list comprises the cables to be connected to the determined connector.

A current cable from the displayed list is then determined in step 609.

Figure 7F:
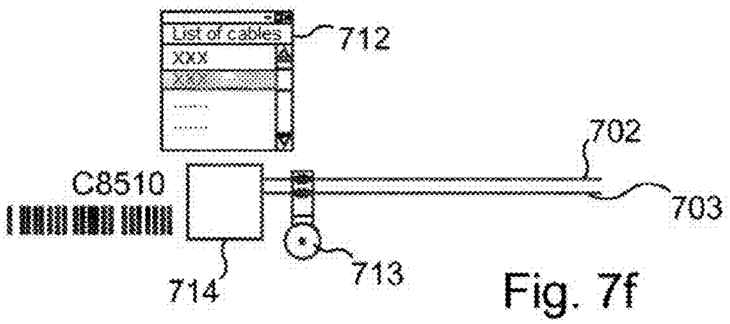

For example, the user has selected the connector to be placed at the end C8510. FIG. 7*f* shows the detail of the display on the screen with the window 712 in which the list of cables to be connected to the selected connector and the cable routing element 713 on to which the cables 702 and 703 are attached are found.

A connector placing marker 714 can also be displayed in order to indicate to the user the location in which to place the connector. For example, the marker 714 shows the outline of the connector to be placed.

Once the list of cables to be connected has been displayed (for example in the window 712) and once the connector placing markers 714 have been displayed, the user can select a cable from the list. To this end, he can for example click on a cable number in the window 712 by means of a mouse of a user interface. The user can also directly tap on the screen if it is a touch screen. The user can also enter the cable number directly via a keyboard. Alternatively, or in combination, the user can use a barcode reader to read a support associated with the cable. For example, a tag attached to the end of the cable if provision is made for this.

Once the current cable has been determined, data relating to a current operation to be performed on the determined cable are displayed on the screen in a step 610.

Figure 7G:
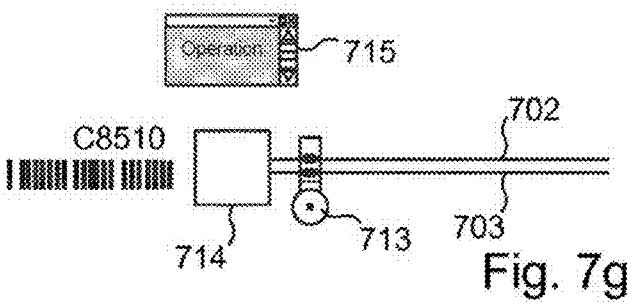

For example, these data are displayed in a window 715 as shown in FIG. 7*g*. The display of the window 715 can be accompanied by hiding the window 712. For example, the window 715 can be displayed instead of the window 712. It can also be displayed beside the window 712.

The data relating to the current operation can comprise the designation of a tool to be used by the user to perform the operation.

The operations to be performed on the cables can be stripping the cable, crimping the contact of the cable, plugging the cable into the tang of the connector, equipping the harness with an accessory or other.

When the data relating to the current operation are displayed, a waiting step 611 is performed.

In this step, for example the wait is for the user to supply an identifier of the tool that he is holding in order to carry out the operation.

Supplying this identifier can for example determine full display of the information to be displayed. For example, the display of the information relating to the current operation can be done in two stages.

Initially, only the identification of the operation ("strip the cable" for example) and the identification of the tool ("stripping pliers No. ° 123456" for example) are displayed.

Then, the user enters an identifier of the tool ("123456" for example). The identifier can be entered via a keyboard. The identifier can also be scanned on a tag attached to the tool.

Once entered, the identifier of the tool is compared with the displayed identifier. If the identifiers correspond, additional information is displayed (for example the length of cable to be stripped or other).

Supplying the identifier can also determine the display of data relating to another operation to be performed on the cable as shown in FIG. 6.

The identifier supplied by the user (on the keyboard, via a barcode scanner or other) is compared with the identifier displayed in step 612.

In the case of non correspondence (NO) an error message can be displayed in a step 613, informing the user of failure to use the tool indicated in the window 715.

In the case of correspondence (YES), there is a return to step 614 during which it is determined whether a following operation is to be performed on the current cable.

If this is the case (YES), there is a return to step 610, in which data relating to this following operation are displayed in the window 715 or in a new window.

In the opposite case (NO), it is determined in a step 615 whether the user must place other connectors from the list of connectors (list displayed in the window 711).

It is for example verified whether all the connectors from the list in the window 711 have been considered.

In order to find whether it is possible to move on to a following connector in the list, it is possible to wait for the user to choose another connector in the list (for example by clicking on another identifier in the list or by entering another identifier on a keyboard or other) or to wait for the user to confirm the arrangement of all the connectors, by closing the window 711.

In this case, if the window 711 had been cleared in order to display the window 715, when in step 612 it was determined that the identifiers correspond, the window 711 can once again be displayed on the screen.

In order to find whether it is possible to move on to a following connector in the list, it is also possible to determine automatically whether all the connectors have been attached onto the attachment surface at the locations indicated by the placing markers. For example, confirmation windows (not shown) can be open close to each marker and allow the user to confirm the attachment of the corresponding connector. It is also possible to determine the attachment of a connector by detecting pressure at the level of the displayed placing marker (for example if the screen used is a touch screen).

If it is determined in step 615 that other connectors are to be arranged on the support (YES), there is a return to the already described step 606.

Otherwise (NO), it is possible to proceed to a step of finalization of the harness, in which marker elements (tags) are placed in the harness. Information relating to the finalization step is displayed in step 616.

When the cables have been arranged on the support in accordance with the wiring diagram and the cables have been connected, the harness can be finalized (by attaching certain cables together for example) and it can be removed from the support.

The cable routing elements can be removed and the support can be reinitialized for the production of a new harness with a different wiring diagram.

A computer program for the implementation of a method according to an embodiment of the invention can be produced by a person skilled in the art on reading the flow chart in FIG. 6 and the present detailed description.

According to the above description, the harness production support allows great flexibility and reconfiguration on demand.

The elements for routing and for attachment of the cables can be repositioned on the support on demand.

Moreover, the wiring diagram for routing the cables of the harness can be displayed dynamically. The difficulties of printing a wiring diagram and storing wiring tables are eliminated. One and the same support can be used for the production of harnesses of different types.

Moreover, a harness support as described above makes it possible to provide assistance to the operative responsible for the production of the harness during all the phases of production of the harness, as well as traceability tools for the different operations.

A computer program for assisting with the production of harnesses can be executed by a computer module controlling the support.

This program can operate from a wiring diagram and descriptive data of the harness. These data can belong to a single data recording medium. These data can belong to a single computer file.

For example, the descriptive data comprise for each cable of the harness:

the connector and the pin of the first end of the cable and the connector and the pin of the second end of the cable, the type of contact to be crimped onto the cable for each of the ends, or other.

The descriptive data can also comprise for each harness the positioning of the cable routing elements in order to support them, by positioning impressions of these supports superimposed on the wiring diagram of the harness.

Once the production support has been configured with the positioning of the cable routing elements, the operative can then proceed to route the cables on the support.

In the preceding description the cables were considered singly. However, it is also possible to consider the cables in groups, in the case where several cables follow the same route. In this case, the group can be identified by an identifier specific to this group.

The cable group can already be equipped with a connector or not.

A use of an electrical harness production support is described below.

When the cables have been arranged on the support, the operative works on the end of the cables at the level of each connector. The operative can be assisted in these operations by the display of relevant data in the form of a dynamic display of this information. The display of the information can be carried out close to the connector concerned so that the operative automatically has this information available in his work area. This is useful in particular in the case where the support is several meters in length.

After the routing of the cables, the list of the connectors to be arranged on the support is presented to the operative. The operative can select a connector from this list by means of a keyboard, a mouse, or by interactivity at the level of the screen of the support. For example, directly reading a barcode displayed close to the connector leads to the opening of a second list showing all the remaining cables to be connected to this connector.

The selection of a cable (via a keyboard, a mouse, by reading a barcode directly on the screen or on a tag attached to the wire) leads for example to the opening of a stripping information window. This window presents to the operative the reference of the stripping tool to be used as well as the length to be stripped. The unit of length for stripping is adapted depending on the configuration of the system (in millimeters, inches or other). Once the stripping is completed, the validation of the end of this phase can be confirmed by reading a barcode arranged on the stripping tool. This barcode corresponds for example to the serial number of the tool. The support can comprise a database in which all the serial numbers of the tools and their correspondence with a tool type reference are recorded. The data medium can also communicate with such a database. During the reading of the barcode of the tool of the computer program controlling the support then checks the correspondence between the tool reference corresponding to the read tool serial number and the expected tool reference (reference displayed in the operative information window). In the case of non correspondence between these two references the operative is warned of the inconsistency and can therefore correct the problem. If the consistency between the references is validated, then the move on to the crimping phase is activated. The operative's control is reinforced, reducing the risk of error. The serial number of the tool can also be recorded and traced so as to make it possible subsequently to find again all the cables that were stripped with this tool, which can be useful in the event that this tool is later found to be defective. The traceability of the tool can also make it possible to monitor the number of uses of the tool. It is thus possible to give a warning when a certain number of uses has been reached, corresponding to the need to check and inspect the tool. Such a support therefore allows good traceability.

Validation of the stripping operation can lead to the move on to the crimping phase. Entry into the crimping phase can be made to happen by the opening of a crimping information window. This window for example presents to the operative the reference of the crimping tool to be used as well as the necessary adjustments on this tool (a tool having several possible adjustments because it can be used with different contacts), but also the reference of the contact to be crimped onto the cable. Once the crimping is completed, the validation of the end of this phase is confirmed by reading a barcode arranged on the crimping tool. This barcode corresponds for example to the serial number of the tool. The support can contain a database in which all the serial numbers of the tools and their correspondence with a tool type reference are recorded or it can communicate with such a database. When the barcode of the tool is read, the computer program then checks the correspondence between the tool reference corresponding to the read tool serial number and the expected tool reference (reference displayed in the operative information window). In the case of non correspondence between these two references the operative is warned of the inconsistency and can therefore rectify the problem. If the consistency between the references is validated, then the move on to the plugging-in phase can be activated.

Again, the operative's control is reinforced, reducing the risk of error. The serial number of the tool can also be recorded and traced so as to make it possible subsequently to retrieve all the cables the contact of which was crimped with this tool, which can be useful in the event that this tool is later found to be defective. The traceability of the tool can also make it possible to monitor the number of uses of the tool. It is thus possible to give a warning when a certain number of uses has been reached, corresponding to the need to check and inspect the tool. Here too, the support allows good traceability.

Validation of the crimping operation can lead to the move on to the plugging-in phase. Entry into the plugging-in phase is made to happen by the opening of the plugging-in information window. This window presents to the operative a rear view of the connector with a graphical representation of the tang of the connector into which the contact that has just been crimped onto the cable must be plugged. References of a tool for the insertion and extraction of the contacts in the connector are displayed if these are necessary for the plugging-in phase.

It is also possible to manage the insertion of the dummy contacts (plastic end pieces mounted in the tang of the connector instead of a contact for the tangs that are not used electrically), by indicating to the operative where to insert these dummy contacts.

The following phase can consist of displaying to the operative the location of the different accessories to be added to the harness, such as marker tags, markers for positioning the harness in the aircraft for which it is intended.

The software of the equipment also makes it possible to manage simultaneous work of several operatives on the same equipment, which is particularly useful on wiring tables of large dimensions.

Generally, the supports according to embodiments can operate in a network, while being linked to a supervisory station. The equipment receives the production orders (list of the harnesses to be produced) from the supervisory station which makes it possible to order the production depending on the availability of the different tables. The traceability information of each operation carried out on each of the tables is sent back to the supervisory station in real time, making it possible to monitor in real time the progress of each of the harnesses in the course of production on the tables.

The interaction of the user with an electrical harness production support according to embodiments can be implemented using various means. As an alternative to or in combination with the keyboard, mouse, barcode reader, and/or touch screen already mentioned above, it is possible to use movement detection technologies.

For example, it is possible to use a light pointer or a predefined shape moved by the user or attached to elements the movement of which can be detected by a camera. The gestures made by the user with the pointer or the predefined shape can then be interpreted as commands or confirmation of the performance of an operation as described above. It is also possible to determine the position of elements or tools with respect to the attachment surface of the electrical harness production support in order to monitor the progression and optionally the correct performance of the production of the electrical harness.

Movement detection technology can be used within the framework of the implementation of touch screen video projectors.

Thus, it is possible to adapt methods according to embodiments to electrical harness production supports without an illuminated screen.

It is moreover also possible to implement voice recognition or other technologies.

In order to reinforce the traceability of the tools used during the production of the harness, wireless communication elements, such as for example RFID chips, can be associated with the tools. The reading of the identifiers of the tools by means of such elements can be used in combination with, or as an alternative to, the reading of barcodes.

The present invention has been described and illustrated in the present detailed description with reference to the attached figures. However, the present invention is not limited to the embodiments presented. Other variants, embodiments and combinations of characteristics can be deduced and implemented by a person skilled in the art on reading the present description and the attached figures.

In order to meet specific needs, a person competent in the field of the invention can apply modifications or adaptations.

For example, the description was given with reference to electrical cables. However, the present invention is not limited to electrical harnesses or electrical cables. A person skilled in the art can adapt the above teachings.

In the claims, the term “comprise” does not exclude other elements or other steps. The indefinite article “a” does not exclude the plural. The different characteristics presented and/or claimed can advantageously be combined. Their presence in the description or in different dependent claims does not in fact exclude the possibility of combining them. Reference signs must not be understood as limiting the scope of the invention.

The invention claimed is:

1. A system for the production of wire harnesses, comprising:

at least one cable routing element (200, 21);

at least one display screen (101) for displaying data for assisting with the production of wire harnesses;

at least one attachment surface (103, 400) associated with said at least one display screen, said at least one attachment surface being configured to receive said at least one cable routing element (200, 21); and a processing unit configured to implement a method for assisting with the production of wire harnesses, the processing unit operatively connected to the at least one display screen (101) and configured to provide the data for assisting with the production of the wire harnesses, wherein said at least one cable routing element comprises an attachment suction cup that attaches said at least one cable routing element to said at least one attachment surface (103, 400) associated with said at least one display screen.

2. The system according to claim 1, wherein, said at least one cable routing element comprises a body having an upper surface and a lower surface, a lever (204) extending from the upper surface of the body and user-movable from a raised position to a lower position, and the attachment suction cup being located at the lower surface of the body, and the attachment suction cup is a lever suction cup such that with the lever in the raised position, a user freely arranges said at least one electrical cable routing element at a desired location on said at least one attachment surface and once said at least one electrical cable routing element is arranged in the desired position, the user moves the lever to the lowered position which attaches the attachment suction cup and said at least one electrical cable routing element onto said at least one attachment surface.

3. The system according to claim 1, wherein said at least one cable routing element comprises at least one second cooperation element for cooperating with a first cooperation element of said at least one attachment surface (103, 400), said cooperation allowing the attachment of said at least one cable routing element to said at least one attachment surface (103, 400).

4. The system according to claim 3, wherein said second cooperation element comprises a rod configured for insertion into a hole of the first attachment element for the attachment of said at least one cable routing element to said at least one attachment surface (103, 400).

5. The system according to claim 1, further comprising:

at least one extension (300), each said one extension (300), where said at least one cable routing element is configured to receive one of said at least one extension (300), wherein said at least one attachment surface is configured to receive said at least one extension (300), and wherein said at least one extension comprises at least one flat portion for attachment of said at least one cable routing element to said at least one extension.

6. The system according to claim 1, further comprising an extension (300) configured to receive a plurality of said at least one cable routing element, wherein said at least one attachment surface is configured to receive said extension (300).

7. The system according to claim 6, wherein said extension comprises another attachment suction cup that attaches said extension to said at least one attachment surface (103, 400) associated with said at least one display screen.

8. The system according to claim 6, wherein, said at least one attachment surface comprises a first cooperation element, said extension (300) comprises at least one second cooperation element for cooperating with said first cooperation element of said at least one attachment surface, said cooperation allowing attachment of said extension to said at least one attachment surface.

9. The system according to claim 8, wherein, first cooperation element comprises a hole, said second cooperation element comprises a rod configured for insertion into the hole of the first attachment element for the attachment of said extension to said at least one attachment surface.

10. The system according to claim 6, wherein, said at least cup cable routing element comprises an arm (302), said extension comprises at least one flat portion for attachment of said arm of said at least cup cable routing element to said extension.

11. The system according to claim 6, wherein said at least one attachment surface or said extension comprises at least one first cooperation element for cooperating with a second cooperation element of said at least one cable routing element or of said extension, said cooperation allowing the attachment of said at least one cable routing element or of said extension to said at least one attachment surface (103, 400).

12. The system according to claim 11, wherein said first cooperation element comprises a hole for the attachment of said at least one cable routing element or of said extension by insertion of a rod of said second cooperation element into said at least one hole.

13. The system according to claim 1, wherein, said at least one attachment surface comprises at least one flat portion for attachment of said suction cup of said at least one cable routing element to said at least one attachment surface (103, 400).

14. The system according to claim 1, wherein the at least one display screen (101) comprises at least one illuminated screen.

15. The system according to claim 1, wherein the at least one display screen (101) comprises at least one touch screen.

16. The system according to claim 1, wherein the at least one display screen (101) comprises at least one rear-projection screen.

17. The system according to claim 1, further comprising a communication interface.

18. The system according to claim 17, wherein said communication interface is configured to receive signals representative of said data for assisting with the production of wire harnesses for display.

19. The system according to claim 17, wherein said communication interface is configured to receive user interface data.

* * * * *